US010897079B2

(12) United States Patent
Hu et al.

(10) Patent No.: US 10,897,079 B2
(45) Date of Patent: Jan. 19, 2021

(54) METAL HOUSING, ANTENNA ASSEMBLY AND ELECTRONIC DEVICE

(71) Applicant: GUANGDONG OPPO MOBILE TELECOMMUNICATIONS CORP., LTD., Dongguan (CN)

(72) Inventors: Shasha Hu, Dongguan (CN); Tianping Liang, Dongguan (CN); Ning Zhao, Dongguan (CN)

(73) Assignee: GUANGDONG OPPO MOBILE TELECOMMUNICATIONS CORP., LTD., Guangdong (CN)

( * ) Notice: Subject to any disclaimer, the term of this patent is extended or adjusted under 35 U.S.C. 154(b) by 290 days.

(21) Appl. No.: 15/752,226

(22) PCT Filed: Mar. 17, 2017

(86) PCT No.: PCT/CN2017/077128
§ 371 (c)(1),
(2) Date: Feb. 12, 2018

(87) PCT Pub. No.: WO2017/157336
PCT Pub. Date: Sep. 21, 2017

(65) Prior Publication Data
US 2019/0260114 A1 Aug. 22, 2019

(30) Foreign Application Priority Data
Mar. 18, 2016 (CN) .......................... 2016 1 0161288

(51) Int. Cl.
*H01Q 3/24* (2006.01)
*H01Q 1/44* (2006.01)
(Continued)

(52) U.S. Cl.
CPC ............... *H01Q 3/24* (2013.01); *H01Q 1/243* (2013.01); *H01Q 1/44* (2013.01); *H01Q 3/247* (2013.01);
(Continued)

(58) Field of Classification Search
CPC .... H01Q 13/106; H01Q 13/103; H01Q 1/242; H01Q 13/10
See application file for complete search history.

(56) References Cited

U.S. PATENT DOCUMENTS 6,624,789 B1 9/2003 Kangasvieri et al.
10,084,234 B2 9/2018 Hu et al.
(Continued)

FOREIGN PATENT DOCUMENTS

CA 2953629 A1 10/2015
CN 102142855 A 8/2011
(Continued)

OTHER PUBLICATIONS

European Patent Application No. 17765878.8 extended Search Report and Opinion dated Sep. 10, 2018, 9 pages.
(Continued)

*Primary Examiner* — Ricardo I Magallanes
(74) *Attorney, Agent, or Firm* — Lathrop GPM LLP

(57) ABSTRACT

A metal housing, an antenna assembly, and an electronic device are provided. The metal housing includes a peripheral frame provided with at least one micro-seam zone which divides the peripheral frame into at least one segment of frame body, each micro-seam zone is formed by at least two micro-seams arranged at intervals, and a metal part is provided between two adjacent micro-seams. The antenna assembly includes the metal housing and at least one switch, the switch includes a first end and at least one second end, the first end is electrically coupled to the frame body divided
(Continued)

by the micro-seam zone, the at least one second end electrically coupled to the metal part, and the at least one segment of frame body divided by the at least one micro-seam zone is an independent antenna comprised by the antenna assembly. The electronic device includes the antenna assembly.

19 Claims, 3 Drawing Sheets

(51) Int. Cl.
  *H01Q 1/24* (2006.01)
  *H01Q 5/321* (2015.01)
  *H01Q 13/10* (2006.01)
  *H05K 5/04* (2006.01)
(52) U.S. Cl.
  CPC ............. *H01Q 5/321* (2015.01); *H01Q 13/10* (2013.01); *H05K 5/04* (2013.01)

(56) References Cited

U.S. PATENT DOCUMENTS

| | | |
|---|---|---|
| 2011/0006953 A1 | 1/2011 | Chiang et al. |
| 2012/0009983 A1* | 1/2012 | Mow ............... H01Q 7/005 455/575.7 |
| 2012/0112969 A1 | 5/2012 | Caballero et al. |
| 2014/0078008 A1 | 3/2014 | Kang et al. |
| 2014/0354487 A1 | 12/2014 | Liang et al. |
| 2016/0064820 A1 | 3/2016 | Kim et al. |
| 2017/0149118 A1* | 5/2017 | Wang ............... H01Q 1/243 |
| 2017/0373388 A1* | 12/2017 | Wang ............... H01Q 9/42 |

FOREIGN PATENT DOCUMENTS

| | | | |
|---|---|---|---|
| CN | 103390793 A | | 11/2013 |
| CN | 203775569 U | | 8/2014 |
| CN | 104103888 A | | 10/2014 |
| CN | 104584324 A | | 4/2015 |
| CN | 104640391 | * | 5/2015 ............... H05K 5/02 |
| CN | 104640391 A | | 5/2015 |
| CN | 104681929 A | | 6/2015 |
| CN | 104953292 A | | 9/2015 |
| CN | 105244599 A | | 1/2016 |
| CN | 105655689 A | | 6/2016 |
| CN | 105655704 A | | 6/2016 |
| CN | 105655705 A | | 6/2016 |
| CN | 105655706 A | | 6/2016 |
| CN | 205583139 U | | 9/2016 |
| EP | 2405534 A1 | | 1/2012 |
| EP | 2493009 A2 | | 8/2012 |
| WO | WO 2012096894 A2 | | 7/2012 |

OTHER PUBLICATIONS

PCT/CN2017/077128 International Search Report dated Jun. 21, 2017, and Written Opinion dated Jun. 20, 2017, 13 pages.
PCT/CN2017/077128 English translation of International Search Report dated Jun. 21, 2017, 2 pages.
PCT/CN2017/077128 English translation of Written Opinion dated Jun. 20, 2017, 6 pages.
Indian Patent Application No. 201837008252 Office Action dated Jun. 25, 2020, 7 pages.
European Patent Application No. 16894062.5 extended Search and Opinion dated Aug. 28, 2018, 8 pages.
Chinese Patent Application No. 201610161287.5 Second Office Action dated Jul. 24, 2017, 4 pages.
Chinese Patent Application No. 201610161287.5 English translation of Second Office Action dated Jul. 24, 2017, 5 pages.
PCT/CN2016/085548 International Search Report and Written Opinion dated Dec. 7, 2016.
PCT/CN2016/085548 English translation of International Search Report and Written Opinion dated Dec. 7, 2016.
Chinese Patent Application No. 201710976109.2 Office Action dated Jul. 3, 2019, 7 pages.
Chinese Patent Application No. 201710976109.2 English translation of Office Action dated Jul. 3, 2019, 10 pages.
U.S. Appl. No. 15/753,330 non-final Office Action dated Oct. 4, 2018, 10 pages.
U.S. Appl. No. 15/966,763 Notice of Allowance dated Aug. 14, 2018, 12 pages.
European Patent Application No. 17765878.8 Office Action dated May 16, 2019, 6 pages.
Indian Patent Application No. 201837008251 Office Action dated May 29, 2020, 7 pages.

* cited by examiner

METAL HOUSING, ANTENNA ASSEMBLY AND ELECTRONIC DEVICE

CROSS-REFERENCE TO RELATED APPLICATION

The present application is a national phase entry under 35 USC § 371 of International Application PCT/CN2017/077128, filed Mar. 17, 2017, which claims the benefit of and priority to Chinese Patent Application No. 201610161288.X, filed Mar. 18, 2016, the entire disclosure of which is incorporated herein by reference.

FIELD

The present application relates to a technical field of electronic products, more particularly to a metal housing, an antenna assembly having the metal housing, and an electronic device having the antenna assembly.

BACKGROUND

Since an appearance design of metal material is highly textured, mobile phones with a metal housing gradually dominate the market. The appearance of the metal housing breaks the conventional design idea for an antenna of the mobile phone, which greatly increases the difficulty of the design for the antenna. In the related art, the metal housing has been considered to serve as a portion of the antenna, and used to radiate a signal.

SUMMARY

In view of this, the present application provides a metal housing, an antenna assembly having the metal housing, and an electronic device having the antenna assembly.

The metal housing includes a peripheral frame provided with at least one micro-seam zone, the at least one micro-seam zone divides the peripheral frame into at least one segment of frame body, each micro-seam zone is formed by at least two micro-seams arranged at intervals, and a metal part is provided between two adjacent micro-seams.

The antenna assembly includes the metal housing and at least one switch, the metal housing includes a peripheral frame provided with at least one micro-seam zone, the at least one micro-seam zone divides the peripheral frame into at least one segment of frame body, each micro-seam zone is formed by at least two micro-seams arranged at intervals, and a metal part is provided between two adjacent micro-seams; the switch includes a first end and at least one second end, the first end is electrically coupled to the frame body divided by the micro-seam zone, the at least one second end is electrically coupled to the metal part, and the at least one segment of frame body divided by the at least one micro-seam zone is an independent antenna comprised by the antenna assembly.

The electronic device includes the antenna assembly, the antenna assembly includes the metal housing and at least one switch, the metal housing includes a peripheral frame provided with at least one micro-seam zone, the at least one micro-seam zone divides the peripheral frame into at least one segment of frame body, each micro-seam zone is formed by at least two micro-seams arranged at intervals, and a metal part is provided between two adjacent micro-seams; the switch includes a first end and at least one second end, the first end is electrically coupled to the frame body divided by the micro-seam zone, the at least one second end is electrically coupled to the metal part, and the at least one segment of frame body divided by the at least one micro-seam zone is an independent antenna comprised by the antenna assembly.

BRIEF DESCRIPTION OF THE DRAWINGS

To describe technical solutions in embodiments of the present application more clearly, the following will briefly introduce the accompanying drawings required for the description of the embodiments. Obviously, the accompanying drawings described below show some embodiments of the present application, and those skilled in the art can obtain other drawings based on these drawings without paying creative efforts.

DETAILED DESCRIPTION

Technical solutions in embodiments of the present application will be clearly and completely described below with reference to the accompanying drawings in the embodiments of the present application. Obviously, the embodiments described herein are only a part but not all of the embodiments of the present application. Based on the embodiments of the present disclosure, all other embodiments obtained by those skilled in the art without paying creative efforts, fall into the protection scope of the present application.

Figure 1:
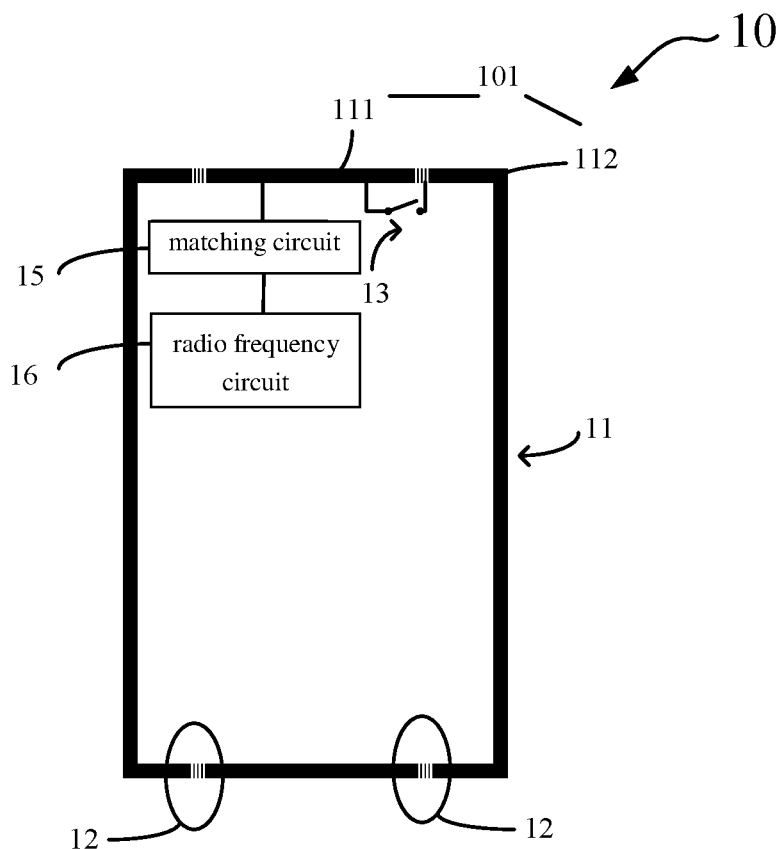
FIG. 1 is a schematic view of an electronic device according to a first embodiment of the present application.

As illustrated in FIG. 1, embodiments of the present application provides an electronic device 10, and the electronic device 10 includes but is not limited to a mobile phone, a palmtop computer, a tablet computer, or other electronic products. The electronic device 10 has a metal housing (not illustrated) and at least one switch 13, and the electronic device 10 is internally provided with a matching circuit 15 and a radio frequency circuit 16. In the present embodiment, for simplicity of description, other assemblies within the electronic device 10 are omitted in the accompanying drawings. The metal housing and the at least one switch 13 substantially form an antenna assembly. The antenna assembly is such an antenna that uses the metal housing as an antenna radiator, and cooperates with the at least one switch 13 to realize expansion of a low-frequency bandwidth of the antenna. The antenna assembly will be described in detail in the following.

Figure 2:
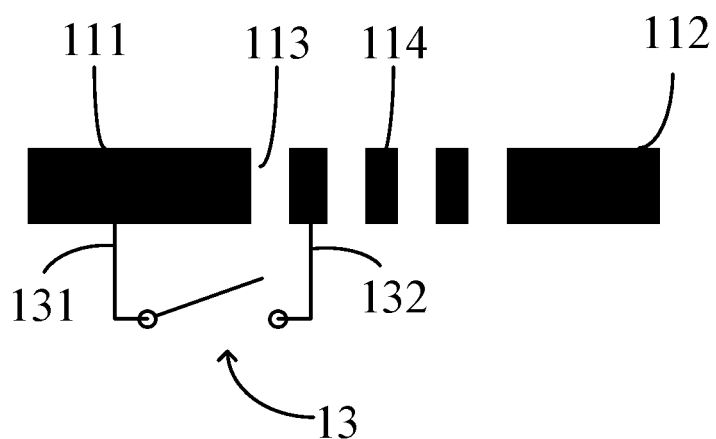
FIG. 2 is an enlarged view of a micro-seam zone electrically coupled to a switch illustrated in FIG. 1.

As illustrated in FIGS. 1 and 2, a peripheral edge of the metal housing has a peripheral frame 11 provided with at least one micro-seam zone 12, the at least one micro-seam zone 12 divides the peripheral frame 11 into at least one segment of frame body 101, the micro-seam zone 12 is formed by at least two micro-seams 113 arranged at intervals, and a metal part 114 is provided between two adjacent micro-seams.

The switch 13 includes a first end 131 and a second end 132, the first end 131 is electrically coupled to the frame body 101 divided by the micro-seam zone 12, the second end 132 is electrically coupled to the metal part 114, and the at least one segment of frame body 101 divided by the at least one micro-seam zone 12 each is an independent antenna. The independent antenna refers to the antenna radiator capable of radiating a radio frequency signal of a certain frequency after being configured. For example, the independent antenna may be the antenna radiator of a GPS antenna, a Wi-Fi antenna, or an NFC antenna.

Specifically, as illustrated in FIG. 1, the peripheral frame 11 is provided with four micro-seam zones 12. Every two micro-seam zones 12 form one segment of the frame body 101 serving as the independent antenna therebetween, therefore four segments of frame bodies 101 are formed. The frame bodies 101 at least include a first frame body 111 and a second frame body 112. The matching circuit 15 is located between the radio frequency circuit 16 and the first frame body 111, and is electrically coupled to the radio frequency circuit 16 and the first frame body 111. The matching circuit 15 is configured to match impedance of the antenna, so as to reduce return loss caused by impedance mismatch. In other embodiments, the number of the micro-seam zones 12 is determined by practical requirements. For example, one, two, or three the micro-seam zones 12 may also be provided.

As illustrated in FIG. 2, the micro-seam zone 12 is formed by at least two micro-seams 113 arranged at intervals, and two adjacent micro-seams 113 have the metal part 114 therebetween. In the present embodiment, a case where there are four micro-seams 113 and three metal parts 114 is taken as an example for description. In other embodiments, the number of the micro-seams 113 or the metal parts 114 is not limited to this, but is determined based on specific design needs. For example, two, or three micro-seams 113 may also be provided.

In the present embodiment, a width of the micro-seam zone 12 is 1.5 mm to 5.0 mm, a width of each micro-seam 113 within the micro-seam zone 12 is 0.05 mm to 0.3 mm, and the micro-seams 113 are arranged at equal intervals. In another embodiment, three micro-seams 113 are provided and arranged at equal intervals. The arrangement of the equally spaced micro-seams 113 is easy to process. In other embodiments, the widths of the micro-seam zone 12 and the micro-seam 113 are determined based on specific design needs and process precision, and/or the micro-seams 113 are arranged at unequal intervals.

As illustrated in FIG. 2, the switch 13 includes the first end 131 and the second end 132. The first end 131 of the switch 13 is electrically coupled to the first frame body 111, and the second end 132 is electrically coupled to one metal part 114 within the micro-seam zone 12. In the present embodiment, the one metal part 114 is adjacent to the first frame body 111. When the switch 13 is closed, an equivalent antenna length is lengthened, and a resonant frequency of the antenna of the first frame body 111 is reduced; when the switch 13 is open, the equivalent antenna length is shortened, and the resonant frequency of the antenna is increased compared with the resonant frequency of the antenna when the switch 13 is closed. Furthermore, the low-frequency bandwidth of the antenna will vary with the change of the resonant frequency of the antenna. Thus, the different low-frequency bandwidths can be obtained by means of the closed and open states of the switch, that is, the low-frequency bandwidth is expanded, and the degree of freedom of performance adjustment of the antenna is increased. In the present embodiment, the switch 13 is a single-pole single-throw switch, and the second end 132 of the switch 13 can only be electrically coupled to one metal part 14, so only one low-frequency bandwidth is expanded.

Figure 3:
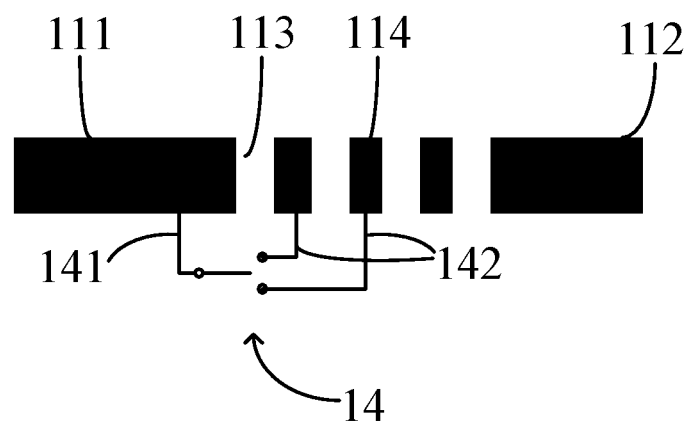
FIG. 3 is an enlarged view of a micro-seam zone electrically coupled to a switch in an electronic device according to a second embodiment of the present application.

As illustrated in FIG. 3, in a second embodiment of the present application, unlike the first embodiment, a switch 14 is a single-pole dual-throw switch, and the switch 14 includes two second ends 142. The two second ends 142 of the switch 14 are electrically coupled to two different metal parts 114 correspondingly. In the present embodiment, two low-frequency bandwidths can be expanded by means of different states of the switch 14. In other embodiments, the switch may be other types of single-pole multi-throw switch, and for example, the switch is a single-pole three-throw switch. The switch includes a plurality of second ends, and the plurality of second ends may be electrically coupled to more different metal parts 114 correspondingly. Thus, the low frequency bandwidth may be further expanded, and the degree of freedom of performance adjustment of the antenna may be further increased.

Further, in above embodiments, an inductance element or a capacitive element is further provided between the switch 13 or 14 and the metal part 14. The performance adjustment of the antenna can be further facilitated by providing an inductor or a capacitor.

Figure 4:
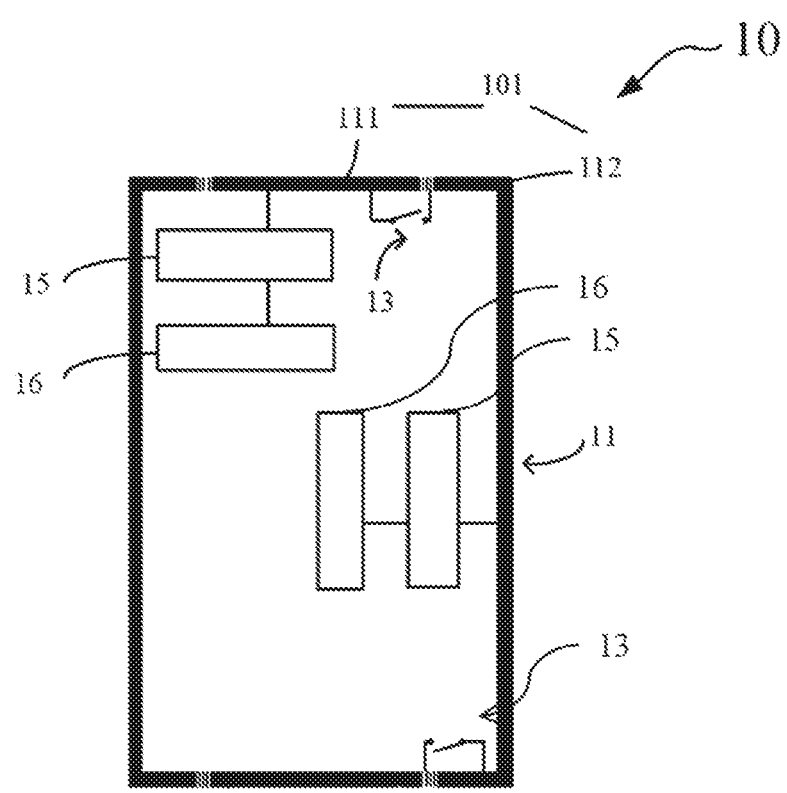
FIG. 4 is a schematic view of an electronic device according to an embodiment of the present application.

In other embodiments, as illustrated in FIG. 4, the number of the switches 13 or 14 may be other numbers, and for example, two switches 13 or 14 are provided. The first frame body 111 is electrically coupled to one or more metal parts 114 within one adjacent micro-seam zone 12 by means of one switch 13 or 14, and the second frame body 112 is electrically coupled to one or more metal parts 114 within another adjacent micro-seam zone 12 by means of the other switch 13 or 14. Therefore, the antenna performance adjustment and expansion for different antennas can be performed by means of the switch.

The first frame body 111 may be a GPS antenna, and the second frame body 112 may be a Wi-Fi antenna. The remaining two frame bodies divided by the four micro-seam zones 12 may be a Bluetooth antenna, an NFC (Near Field Communication) antenna, or the like.

Therefore, in the electronic device of the present application, by providing the micro-seam zone including at least two micro-seams arranged at intervals to the peripheral frame of the metal housing, the peripheral frame is divided into at least one segment of frame body serving as the independent antenna and the metal part located between the adjacent micro-seams, such that two ends of the switch are electrically coupled to the frame body and the metal part correspondingly. When the state of the switch is changed, the equivalent length of the antenna is changed, and the resonant frequency of the antenna is changed therewith, such that the different low-frequency bandwidths can be obtained. Thus, the low-frequency bandwidth of the antenna of the electronic device is expanded, and the degree of freedom of performance adjustment of the antenna is increased.

The above reveals specific embodiments of the present application, but the protection scope of the present application is not limited to this, it is conceivable for those skilled in the art to make various equivalent modifications or replacements within the technical scope disclosed by the present application, and these modifications or replacements are deemed to fall into the protection scope of the present application. Therefore, the protection scope of the present application is subject to the protection scope of the claims.

What is claimed is:
1. An electronic device, comprising:
   an antenna assembly comprising a metal casing and at least one switch, the metal casing comprising a peripheral frame provided with at least one micro-seam zone, the at least one micro-seam zone dividing the peripheral frame into at least one segment of frame body, each micro-seam zone being formed by at least two micro- seams arranged at intervals, and a metal piece being provided between two adjacent micro-seams;

the switch comprising a first end and at least one second end, the first end being electrically coupled to the frame body divided by the micro-seam zone, the at least one second end electrically coupled to the metal piece, and the at least one segment of frame body divided by the at least one micro-seam zone being an independent antenna comprised by the antenna assembly, wherein the peripheral frame is provided with four micro-seam zones and every two micro-seam zones form one segment of frame body such that four frame bodies are formed; the frame bodies at least comprise a first frame body and a second frame body and two switches are provided, the first frame body is electrically coupled to one or more metal pieces within one adjacent micro-seam zone by means of one of the two switches, and the second frame body is electrically coupled to one or more metal pieces within another adjacent micro-seam zone by means of the other of the two switches.

2. The electronic device according to claim 1, wherein a width of the micro-seam zone is 1.5 mm to 5.0 mm.

3. The electronic device according to claim 1, wherein a width of the micro-seam is 0.05 mm to 0.3 mm.

4. An antenna assembly, comprising:
a metal housing and at least one switch, the metal housing comprising a peripheral frame provided with at least one micro-seam zone, the at least one micro-seam zone dividing the peripheral frame into at least one segment of frame body, each the micro-seam zone being formed by at least two micro-seams arranged at intervals, and a metal part being provided between two adjacent micro-seams;

the switch comprising a first end and at least one second end, the first end being electrically coupled to the frame body divided by the micro-seam zone, the at least one second end electrically coupled to the metal part, and the at least one segment of frame body divided by the at least one micro-seam zone being an independent antenna comprised by the antenna assembly, wherein the peripheral frame is provided with four micro-seam zones and every two micro-seam zones form one segment of frame body such that four frame bodies are formed; the frame bodies at least comprise a first frame body and a second frame body and two switches are provided, the first frame body is electrically coupled to one or more metal parts within one adjacent micro-seam zone by means of one of the two switches, and the second frame body is electrically coupled to one or more metal parts within another adjacent micro-seam zone by means of the other of the two switches.

5. The antenna assembly according to claim 4, wherein the switch is a single-pole single-throw switch, the switch comprises one second end, and the one second end is electrically coupled to one metal part within the micro-seam zone.

6. The antenna assembly according to claim 4, wherein the micro-seam zone is formed by three micro-seams arranged at intervals; the switch is a single-pole multi-throw switch, the switch comprises a plurality of second ends, and the plurality of second ends are coupled to the different metal parts within the same micro-seam zone correspondingly.

7. The antenna assembly according to claim 4, wherein the antenna assembly further comprises an inductor or a capacitor coupled to the switch.

8. The antenna assembly according to claim 4, wherein the antenna assembly further comprises a matching circuit and a radio frequency circuit, and the matching circuit is located between the radio frequency circuit and the frame body and is electrically coupled to each of the radio frequency circuit and the frame body.

9. The antenna assembly according to claim 4, wherein the frame body is one of a GPS antenna, a Bluetooth antenna, a Wi-Fi antenna and an NFC antenna.

10. The antenna assembly according to claim 4, wherein a width of the micro-seam zone is 1.5 mm to 5.0 mm.

11. The antenna assembly according to claim 4, wherein a width of the micro-seam is 0.05 mm to 0.3 mm.

12. The electronic device according to claim 1, wherein each micro-seam zone comprises at least three micro-seams, and the at least three micro-seams are arranged at equal intervals.

13. The electronic device according to claim 1, wherein the switch is a single-pole single-throw switch, the switch comprises one second end, and the one second end is electrically coupled to one metal piece within the micro-seam zone.

14. The electronic device according to claim 1, wherein the micro-seam zone is formed by three micro-seams arranged at intervals; the switch is a single-pole multi-throw switch, the switch comprises a plurality of second ends, and the plurality of second ends are coupled to the different metal pieces within the same micro-seam zone correspondingly.

15. The electronic device according to claim 1, wherein the antenna assembly further comprises an inductor or a capacitor coupled to the switch.

16. The electronic device according to claim 1, wherein the frame body is one of a GPS antenna, a Bluetooth antenna, a Wi-Fi antenna and an NFC antenna.

17. The antenna assembly according to claim 4, wherein the first frame body is a GPS antenna, and the second frame body is a Wi-Fi antenna.

18. The electronic device according to claim 1, wherein the first frame body is a GPS antenna, and the second frame body is a Wi-Fi antenna.

19. The antenna assembly according to claim 4, wherein each micro-seam zone comprises at least three micro-seams, and the at least three micro-seams are arranged at equal intervals.

* * * * *